(12) United States Patent
Benwadih et al.

(10) Patent No.: US 10,586,938 B2
(45) Date of Patent: Mar. 10, 2020

(54) ORGANIC OPTOELECTRONIC DEVICE, ARRAY OF SUCH DEVICES AND METHOD FOR PRODUCING SUCH ARRAYS

(71) Applicants: COMMISSARIAT A L'ENERGIE ATOMIQUE ET AUX ENERGIES ALTERNATIVES, Paris (FR); ISORG, Grenoble (FR); TRIXELL, Moirans (FR)

(72) Inventors: Mohammed Benwadih, Champagny sur Marne (FR); Simon Charlot, Montferrat (FR); Jean-Yves Laurent, Domene (FR); Jean-Marie Verilhac, Coublevie (FR); Emeline Berthod, Grenoble (FR); Pierre Rohr, Moirans (FR)

(73) Assignees: COMMISSARIAT A L'ENERGIE ATOMIQUE ET AUX ENERGIES ALTERNATIVES, Paris (FR); ISORG, Grenoble (FR); TRIXELL, Moirans (FR)

( * ) Notice: Subject to any disclaimer, the term of this patent is extended or adjusted under 35 U.S.C. 154(b) by 0 days.

(21) Appl. No.: 16/060,946

(22) PCT Filed: Dec. 21, 2016

(86) PCT No.: PCT/EP2016/082064
§ 371 (c)(1),
(2) Date: Jun. 10, 2018

(87) PCT Pub. No.: WO2017/108882
PCT Pub. Date: Jun. 29, 2017

(65) Prior Publication Data
US 2018/0366669 A1 Dec. 20, 2018

(30) Foreign Application Priority Data
Dec. 23, 2015 (FR) ...................................... 15 63286

(51) Int. Cl.
*H01L 51/42* (2006.01)
*H01L 27/30* (2006.01)
(Continued)

(52) U.S. Cl.
CPC ........ *H01L 51/4213* (2013.01); *H01L 27/308* (2013.01); *H01L 51/0002* (2013.01);
(Continued)

(58) Field of Classification Search
CPC ............ H01L 51/4213; H01L 51/4253; H01L 51/0026; H01L 51/0096; H01L 51/0002;
(Continued)

(56) References Cited

U.S. PATENT DOCUMENTS 7,772,484 B2 * 8/2010 Li ...................... H01G 9/2027
136/244
2003/0140959 A1 * 7/2003 Gaudiana ............. H01G 9/2031
136/244
(Continued)

FOREIGN PATENT DOCUMENTS

EP 2 490 235 A1 8/2012
WO 2011/141717 A1 11/2011
(Continued)

OTHER PUBLICATIONS

Shrotriya, et al., "High-efficiency solution processable polymer photovoltaic cells by self-organization of polymer blends", Nature materials, vol. 4, Issue 11, pp. 864-868, 2005.
(Continued)

*Primary Examiner* — Golam Mowla
(74) *Attorney, Agent, or Firm* — Baker & Hostetler LLP

(57) ABSTRACT

An optoelectronic device includes a stack of layers that are arranged on an electrically insulating substrate, including at least one cathode made of a material of work function $\Phi_1$; one electron-collecting layer that is arranged above the
(Continued)

cathode and that is made of a material of work function $\varphi_2$ and of sheet resistance R; and one active layer comprising at least one p-type organic semiconductor the energy level of which is HO1, wherein the work function $\varphi_2$ of the electron-collecting layer and the energy level HO1 of the active layer form a potential barrier able to block the injection of holes from the cathode into the active layer; and the sheet resistance R of the electron-collecting layer is higher than or equal to $10^8 \Omega$.

13 Claims, 5 Drawing Sheets

(51) Int. Cl.
*H01L 51/00* (2006.01)
*B82Y 30/00* (2011.01)

(52) U.S. Cl.
CPC ...... *H01L 51/0026* (2013.01); *H01L 51/0096* (2013.01); *H01L 51/4253* (2013.01); *B82Y 30/00* (2013.01); *Y02E 10/549* (2013.01); *Y02P 70/521* (2015.11)

(58) Field of Classification Search
CPC ..... H01L 27/308; B82Y 30/00; Y02P 70/521; Y02E 10/549
See application file for complete search history.

(56) References Cited

U.S. PATENT DOCUMENTS

| | | | | |
|---|---|---|---|---|
| 2004/0084080 | A1* | 5/2004 | Sager | H01L 51/4226 136/263 |
| 2004/0195960 | A1* | 10/2004 | Czeremuszkin | C08J 7/045 313/504 |
| 2005/0263179 | A1* | 12/2005 | Gaudiana | H01G 9/2027 136/244 |
| 2005/0274408 | A1* | 12/2005 | Li | H01G 9/2027 136/244 |
| 2008/0295889 | A1* | 12/2008 | Schindler | B82Y 10/00 136/263 |
| 2012/0060926 | A1 | 3/2012 | Hsu et al. | |
| 2013/0269766 | A1 | 10/2013 | Park et al. | |
| 2013/0333739 | A1* | 12/2013 | Huang | B82Y 10/00 136/244 |
| 2018/0375058 | A1* | 12/2018 | Kawamura | H05B 33/12 |

FOREIGN PATENT DOCUMENTS

| | | |
|---|---|---|
| WO | 2012/135527 A1 | 10/2012 |
| WO | 2015/169623 A1 | 11/2015 |

OTHER PUBLICATIONS

Jeong, et al., "Inverted Organic Photodetectors With ZnO Electron-Collecting Buffer Layers and Polymer Bulk Heterojunction Active Layers", Selected Topics in Quantum Electronics, IEEE Journal of, vol. 20, Issue 6, pp. 130-136. Nov.-Dec. 2014.

* cited by examiner

ORGANIC OPTOELECTRONIC DEVICE, ARRAY OF SUCH DEVICES AND METHOD FOR PRODUCING SUCH ARRAYS

CROSS-REFERENCE TO RELATED APPLICATIONS

This application is a National Stage of International patent application PCT/EP2016/082064, filed on Dec. 21, 2016, which claims priority to foreign French patent application No. FR 1563286, filed on Dec. 23, 2015, the disclosures of which are incorporated by reference in their entirety.

FIELD OF THE INVENTION

The invention relates to an organic optoelectronic device and to a matrix array of such devices, i.e. to a matrix array of photodetectors (pixelated imager) or a display matrix array. The invention is in particular, but not exclusively, applicable to the production of large-area matrix-array x-ray imagers that are based on an indirect detection principle and that preferably employ organic semiconductors, possible applications thereof being medical radiology, nondestructive inspection and security screening.

BACKGROUND

In the field of x-ray imaging, two detection modes are commonly employed. A first mode, called the direct detection mode, consists in using a matrix array of photodetectors, each photodetector being able to convert the x-rays that it absorbs into electric charge. A second mode, called the indirect mode, consists in initially converting the x-rays into visible photons, via a scintillator, and then in using a matrix array of photodetectors to convert the produced visible photons into electric charge. The invention relates to a matrix array of pixels for indirect detection of x-rays, each pixel being composed of at least one thin film transistor (TFT) coupled to an organic photodetector. In each of the pixels, a transistor is commonly connected to a first electrode of an organic photodetector.

A layer suitable for the photo-conversion of light is commonly deposited on the first electrode. This layer may for example be organic and include a nanostructured mixture of p-type and n-type semiconductors (Li, G., Shrotriya, V., Huang, J., Yao, Y., Moriarty, T., Emery, K., & Yang, Y., 2005, *High-efficiency solution processable polymer photovoltaic cells by self-organization of polymer blends*, Nature materials, 4(11), 864-868). A top electrode is then deposited on the photo-conversion layer.

FIG. 1 schematically illustrates the structure of an organic photodiode according to the prior art. The stack for example includes a transparent substrate (made of glass, polyethylene naphthalate (PEN) or polyethylene terephthalate (PET)). This substrate is covered with a transparent metal electrode (for example made of indium tin oxide (ITO)) and then a hole-collecting layer (HCL) that is able to collect holes during an illumination, this layer for example being made of poly(3,4-ethylenedioxythiophene)-poly(styrene sulfonate) (PEDOT:PSS). These layers are covered by a layer suitable for the photo-conversion, which is called the active layer and produced such as described above. Lastly, the active layer is covered with an electron-collecting layer (ECL), which is for example made of aluminum. In the example illustrated in FIG. 1, the photodiode is illuminated through the transparent substrate: this illuminating mode, and the structure of the photodiode, are said to be direct. Layers for transporting the charge carriers are electrically connected to the layers for collecting the charge carriers (HCL and ECL). In the direct structure illustrated in FIG. 1, the transport of the holes is achieved via an ITO layer and the transport of the electrons is achieved via an aluminum layer.

FIG. 2 schematically illustrates an organic photodiode of so-called inverted structure, according to the prior art. The illustrated photodiode includes a transparent substrate covered with a transparent electron-transporting layer (ETL), itself covered with a transparent electron-collecting layer (ECL). These layers are covered with an active layer and a hole-collecting layer (HCL). The HCL is for example covered by a silver layer, the function of which is both to allow the transport of the holes (HTL) and to reflect incident light coming from the substrate. The ECL is for example made of zinc oxide (ZnO) or of titanium oxide ($TiO_x$) and the HCL is for example made of PEDOT: PSS or of a metal oxide such as molybdenum oxide, tungsten oxide or vanadium oxide. A structure of this type is disclosed by Jeong, J. et al., *Inverted Organic Photodetectors With ZnO Electron-Collecting Buffer Layers and Polymer Bulk Heterojunction Active Layers*, Selected Topics in Quantum Electronics, IEEE Journal of, 20(6), 130-136.

In these two direct or inverted photodiode structures, light may be absorbed by the various layers, and in particular by the top electrode and/or the bottom electrode.

It would be desirable to manufacture a matrix array of inverted organic photodiodes such as described above for medical imaging applications. This type of imaging requires very low detection thresholds. One of the ways of achieving a low detection threshold is to limit or even to suppress the dark current of a photodiode, i.e. the residual current of the photodiode in the absence of illuminating light, when the photodiode is biased. If the work function of the material of the electron-collecting layer is too high, it promotes parasitic injection of holes from this layer into the donor of the active layer. One of the solutions of the prior art is to make a bottom electrode (electrode in contact with the substrate) from a metal the work function of which is lower than that of commonly used materials (generally ITO). For example, aluminum and chromium have a work function lower than ITO. These materials have the drawback of being unstable in the presence of air because they are easily oxidizable.

This technical problem may be partially solved, as described by Jeong, J. et al. by using an electron-collecting layer that is interstitial between the bottom electrode and the active layer, and the role of which is to decrease the work function of the material making contact with the active layer: zinc oxide (ZnO) may be used for this purpose. The ZnO used is a semiconductor: its use in a whole-area deposition (without a pattern-defining lithography step) is technically problematic, because leakage currents may be generated between the various pixels of a photodiode matrix array. A defective pixel, for example in the case of a work function that is accidentally unsuitable for the active layer, may induce leakage currents in all of the neighboring pixels and make the zone of pixels that surrounds it unsuitable for imaging. A lithography step allowing the electron-collecting layer to be etched in order to separate the various pixels electrically could be one technical solution. This step is undesirable in a manufacturing process in which having too many required lithography steps in succession compromises the production of the device and/or its manufacturing yield.

SUMMARY OF THE INVENTION

The invention aims to remedy the aforementioned drawbacks of the prior art, and more particularly to produce a matrix-array organic optoelectronic device the leakage currents of which are minimized while allowing the number of photolithography steps carried out during the manufacture of such a device to be limited.

One subject of the invention allowing this aim to be completely or partially achieved is an optoelectronic device comprising a stack of planar thin layers that are arranged on an electrically insulating substrate, including at least:
one cathode made of a material of work function $\Phi_C$;
one electron-collecting layer that is arranged above said cathode and that is made of a material of work function $\Phi_1$ and of sheet resistance R;
one active layer comprising at least one p-type organic semiconductor, the energy level of the highest occupied molecular orbital of which is HO1, and an n-type semiconductor, said layer being suitable for emitting or detecting light and being arranged above said electron-collecting layer;
one hole-collecting layer that is arranged above said active layer; and
one anode that is arranged above said hole-collecting layer;
characterized in that:
said work function $\Phi_1$ of said electron-collecting layer and said energy level HO1 of said active layer form a potential barrier able to block the injection of holes from said cathode into said active layer; and
said sheet resistance R of said electron-collecting layer is higher than or equal to $10^8 \Omega$.

Advantageously, said work function $\Phi_1$ of said electron-collecting layer of the device is strictly lower than said work function $\Phi_C$ of said cathode.

Advantageously, said material of said electron-collecting layer of the device is chosen from zinc oxide and titanium oxide.

Another subject of the invention is a matrix-array optoelectronic device including a plurality of optoelectronic devices and an electron-collecting layer that is common to at least one portion of said optoelectronic devices and materially continuous between each of said optoelectronic devices.

Advantageously, the sheet resistance R of said common collecting layer of the matrix-array optoelectronic device is able to block currents of charge carriers between said optoelectronic devices of said portion or portions, in said material of said common collecting layer.

Advantageously, the resistivity of said material of said common electron-collecting layer of said matrix-array optoelectronic device is lower in the thickness direction of said electron-collecting layer than in a direction of the main plane of said electron-collecting layer.

Advantageously, a said common electron-collecting layer of said matrix-array optoelectronic device includes crystallites that are arranged in columns in the thickness direction of said electron-collecting layer.

Advantageously, the matrix-array optoelectronic device includes at least one stabilizing layer arranged between said common electron-collecting layer and at least one active layer, wherein said stabilizing layer is able to decrease the dependency of the resistivity of the material of a said common electron-collecting layer on luminosity.

Advantageously, the material of said stabilizing layer of said matrix-array optoelectronic device is an opaque oxide that is preferably chosen from tin oxide and palladium oxide.

Advantageously, the material of said common electron-collecting layer of said matrix-array optoelectronic device includes p-type dopants.

Advantageously, said p-type dopants are chosen from palladium, cobalt, copper and molybdenum.

Advantageously, at least one said electron-collecting layer of said matrix-array optoelectronic device includes metal-oxide nanoparticles and polar polymers, said polar polymers being grafted onto said metal-oxide nanoparticles.

Advantageously, at least one element chosen from a substrate, a cathode, an electron-collecting layer, an active layer, a hole-collecting layer and an anode of said matrix-array optoelectronic device is transparent.

Advantageously, said matrix-array optoelectronic device includes a layer of scintillator material, said layer being arranged above each said anode.

Another subject of the invention is a process for manufacturing an optoelectronic device comprising a stack of planar thin layers that are arranged on an electrically insulating substrate, including at least:
one cathode made of a material of work function Dc;
one electron-collecting layer that is arranged above said cathode and that is made of a material of work function $\Phi_1$ and of sheet resistance R;
one active layer comprising at least one p-type organic semiconductor, the energy level of the highest occupied molecular orbital of which is HO1, and an n-type semiconductor, said layer being suitable for emitting or detecting light and being arranged above said electron-collecting layer;
one hole-collecting layer that is arranged above said active layer; and
one anode that is arranged above said hole-collecting layer;
including at least one step of depositing the material of a said electron-collecting layer by cathode sputtering at a temperature comprised between 0° C. and 100° C. in an atmosphere containing at least 1% and preferably at least 2% by mass dioxygen.

Another subject of the invention is a process for manufacturing an optoelectronic device comprising a stack of planar thin layers that are arranged on an electrically insulating substrate, including at least:
one cathode made of a material of work function $\Phi_c$;
one electron-collecting layer that is arranged above said cathode and that is made of a material of work function $\Phi_1$ and of sheet resistance R;
one active layer comprising at least one p-type organic semiconductor, the energy level of the highest occupied molecular orbital of which is HO1, and an n-type semiconductor, said layer being suitable for emitting or detecting light and being arranged above said electron-collecting layer;
one hole-collecting layer that is arranged above said active layer; and
one anode that is arranged above said hole-collecting layer;
said process including at least one step of forming a said electron-collecting layer using a sol-gel process, said sol-gel process including a step of depositing a solution containing precursor polymers, said precursor polymers being chosen from metal acetates, metal nitrates and metal chlorides.

Advantageously, said solution includes p-type dopants.

Another subject of the invention is a process for manufacturing a matrix-array optoelectronic device including a plurality of optoelectronic devices arranged in a pattern, comprising a stack of planar thin layers that are arranged on an electrically insulating substrate, including at least:
one cathode made of a material of work function $\Phi_C$;

one common electron-collecting layer, including a first sublayer and a plurality of second sublayers, that is arranged above each said cathode and that is made of a material of work function $\Phi_1$ and of sheet resistance R;

one active layer comprising at least one p-type organic semiconductor, the energy level of the highest occupied molecular orbital of which is HO1, and an n-type semiconductor, said layer being suitable for emitting or detecting light and being arranged above said electron-collecting layer;

one hole-collecting layer that is arranged above said active layer; and one anode that is arranged above said hole-collecting layer;

said process including at least two sub-steps of depositing said electron-collecting layer consisting in:

depositing a first common electron-collecting sublayer; and depositing a plurality of second sublayers in a pattern corresponding to said pattern of said optoelectronic devices.

BRIEF DESCRIPTION OF THE DRAWINGS

The invention will be better understood and other advantages, details and features thereof will become apparent from the explanatory description that follows, which is given by way of example with reference to the appended drawings, in which.

DETAILED DESCRIPTION

Figure 1:
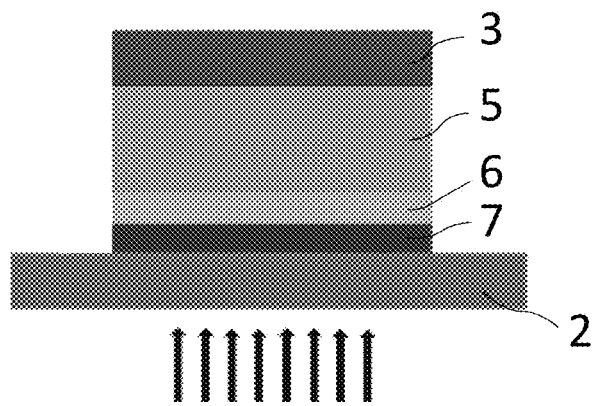
FIG. 1 schematically illustrates the structure of an organic photodiode according to the prior art.

FIG. 1 schematically illustrates the structure of a prior-art optoelectronic device. The illustrated device is a photodiode of direct structure, such as described above.

Figure 2:
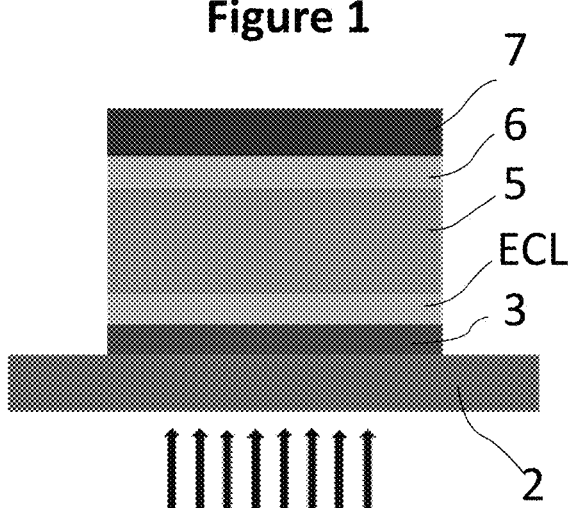
FIG. 2 schematically illustrates an organic photodiode of so-called inverted structure, according to the prior art.

FIG. 2 schematically illustrates an organic photodiode of so-called inverted structure, according to the prior art.

Figure 3:
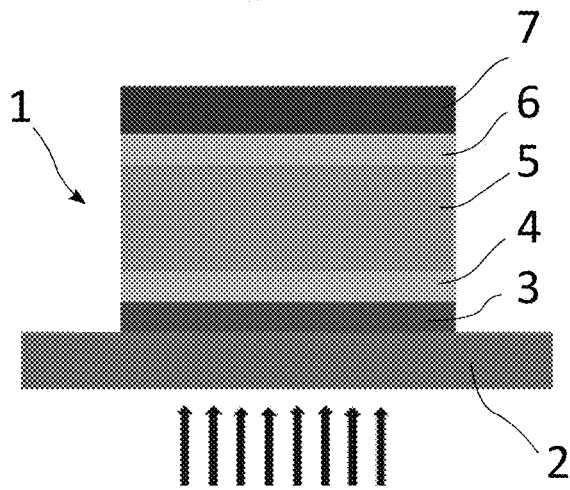
FIG. 3 schematically illustrates the structure of an optoelectronic device of inverted structure according to one embodiment of the invention.

FIG. 3 schematically illustrates the structure of an optoelectronic device 1 with an inverted structure, according to one embodiment of the invention. The optoelectronic device 1 includes a transparent substrate 2, from under which the optoelectronic device 1 may be illuminated. By transparent, what is meant is able to completely or partially transmit electromagnetic waves the wavelengths of which are comprised in the range of the visible and/or of the near ultraviolet and/or of the near infrared. The illumination is represented by black arrows that are directed upward in FIG. 3. The substrate 2 may be made of glass, of PEN, or of PET. A stack of planar thin layers partially forming the optoelectronic device 1 is arranged on the substrate 2.

A cathode 3 is arranged above the substrate 2. The cathode 3 is made of a material the work function of which is denoted $\Phi_c$. In embodiments of the invention, a cathode 3 may be made of ITO. The cathode 3 may also be qualified, in this structure, an electron-transporting layer or ETL.

An electron-collecting layer 4 is arranged above the cathode 3. The work function of the material of the electron-collecting layer 4 is denoted $\Phi_1$ and the sheet resistance (measured in $\Omega/\square$ and/or in $\Omega$) of the electron-collecting layer 4 is denoted R. In embodiments of the invention, R is strictly higher than $10^8 \Omega$, preferably strictly higher than $10^{10}\Omega$ and preferably strictly higher than $10^{11}\Omega$. The electron-collecting layer 4 may be made of titanium oxide ($TiO_x$) or of zinc oxide (ZnO).

An active layer 5 is arranged above the electron-collecting layer 4. An active layer 5 includes at least one p-type organic semiconductor, the energy level of the highest occupied molecular orbital of which is denoted HO1, and an n-type semiconductor, and is suitable for emitting or detecting light. The active layer 5 is arranged above said electron-collecting layer 4. The active layer 5 for example includes a mixture of polymers and fullerenes. The active layer 5 is for example deposited via a coating operation, in a solvent of mesitylene type, with a dry thickness of 200 nm after thermal annealing. This layer is a nanostructured mixture between an electron-donor material (regioregular poly(3-hexylthiophene), known as RR P3HT) and an electron-acceptor material (di[1,4]methanonaphthaleno[1,2:2',3';56,60:2",3"][5,6]fullerene-$C_{60}$-Ih, known as ICBA) with a mass ratio of 1:2. The active layer 5 may cover the entire matrix array. It may also be deposited by spray coating in a chlorobenzene-type solvent, with a dry thickness of 800 nm after thermal annealing. This layer may also be a nanostructured mixture between an electron-donor material (Poly[(4,8-bis-(2-ethylhexyloxy)-benzo(1,2-b:4,5-b')dithiophene)-2,6-diyhalt-(4-(2-ethylhexanoyl)-thieno[3,4-b]thiophene-)-2-6-diyl)], known as PBDTTT-C) and an electron-acceptor material ([6,6]-Phenyl-C71-butyric acid methyl ester, known as [70] PCBM) with a mass ratio of 1:2.

A hole-collecting layer (HCL) 6 is arranged above the active layer 5. In embodiments of the invention, the hole-collecting layer 6 is made from a material chosen from PEDOT:PSS, molybdenum oxide ($MoO_3$), tungsten oxide ($WO_3$) and vanadium oxide ($V_2O_5$).

An anode 7 is arranged above the hole-collecting layer 6. In one embodiment of the invention, the anode is a metal reflector, for example made of silver, which has the advantage of increasing the efficiency of the optoelectronic device 1. The anode may also be qualified a hole-transporting layer HTL.

In embodiments of the invention, the work function $\Phi_1$ of the electron-collecting layer 4 and the energy level of the highest occupied molecular orbital, which is denoted HO1, of the p-type material of the active layer 5 form a potential barrier able to block the injection of holes from the cathode 3 into the active layer 5. This barrier is strictly higher than 0.3 eV, preferably strictly higher than 0.4 eV and preferably strictly higher than 0.5 eV. The detail of the energy levels of the various layers of the devices is described in FIG. 5.

In one embodiment of the invention, the optoelectronic device is suitable for being illuminated from above. The anode 7 may in this case be transparent. This embodiment allows the scattering of incident light rays through the substrate to be avoided, and a better resolution to be obtained in the case of a matrix-array arrangement of a plurality of optoelectronic devices 1.

Figure 4:
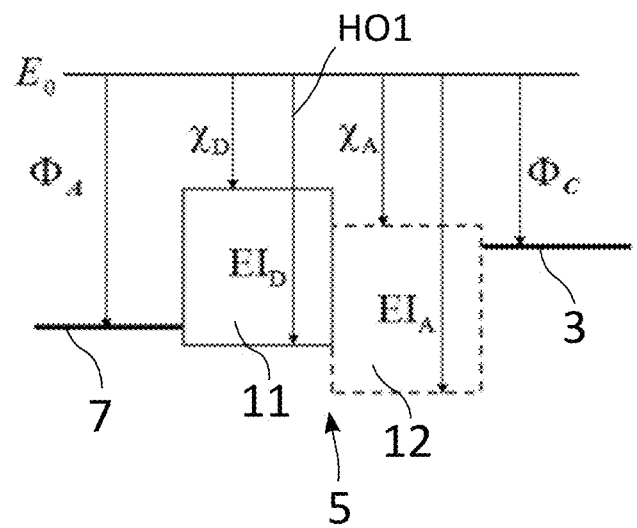
FIG. 4 illustrates a band diagram corresponding to a structure of an optoelectronic device according to the prior art.

FIG. 4 illustrates a band diagram corresponding to a structure of an optoelectronic device according to the prior art. The work function of the anode 7 (denoted $\Phi_A$) and of the cathode 3 (denoted $\Phi_C$) is defined as the energy difference between the Fermi level of the material of each of the layers and the vacuum level $E_0$. The electron affinity of the active layer 5 is defined as the energy difference between the lowest vacant molecular orbital (called BV or LUMO) of the active layer 5 and the vacuum level $E_0$, and may be denoted $\chi_D$ and $\chi_A$ for the donor material 11 of the active layer 5 and the acceptor material 12 of the active layer 5, respectively. The ionization energy of the active layer 5 is defined by the energy difference between the highest occupied molecular orbital (called HO or HOMO) of the active layer 5 and the vacuum level $E_0$, and may be denoted $EI_D$ and $EI_A$ for the donor material 11 of the active layer 5 and the acceptor material 12 of the active layer 5, respectively. The HO of the donor 11 of the active layer 5 is denoted HO1.

Figure 5:
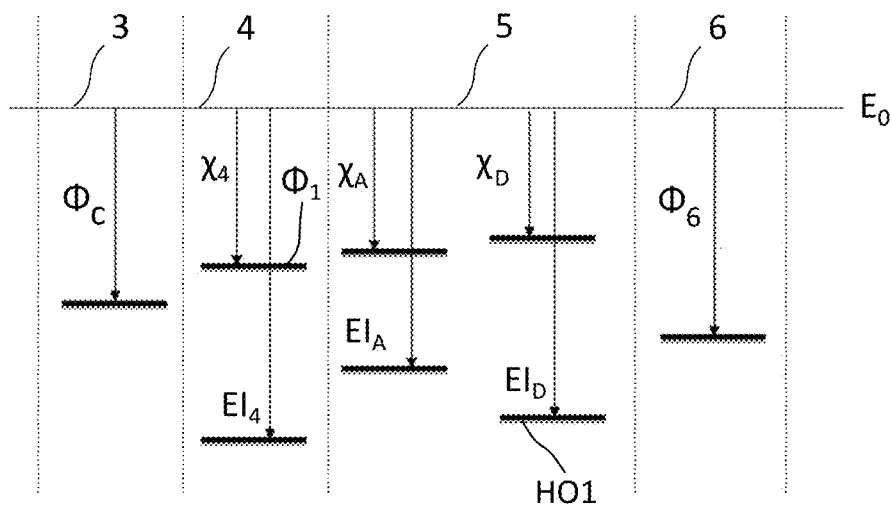
FIG. 5 illustrates a band diagram corresponding to a structure of one embodiment of the invention.

FIG. 5 illustrates a band diagram corresponding to a structure according to one embodiment of the invention. The cathode 3 is characterized by a work function denoted $\Phi_C$. If the cathode 3 is made of ITO, $\Phi_C$=4.7 eV. The electron-collecting layer 4 is characterized by an electron affinity $\chi_4$ and by an ionization energy $EI_4$. If the electron-collecting layer 4 is made of ZnO, $\chi_{4=4.2}$ eV, $\Phi_1$=4.2 eV and $EI_4$=7.5 eV. The active layer 5 is characterized by an electron affinity $\chi_D$ of the donor 11, by an ionization energy $EI_D$ of the donor 11, by an electron affinity $\chi_A$ of the acceptor 12 and by an ionization energy $EI_A$ of the acceptor. In the case of an embodiment such as illustrated in FIG. 3, these energy levels may correspond to $\chi_D$=3.7 eV, $EI_D$=5.15 eV, $\chi_A$=3.9 eV and $EI_A$=6.0 eV. The hole-collecting layer 6 is characterized by a work function $\Phi_6$, which may be comprised between 4.9 eV and 5.5 eV if the layer is made of PEDOT:PSS.

The contacts of the optoelectronic device 1 must have a work function suitable for optimizing the injection and above all, in the context of the described application, the collection of the photo-generated charge. Ideally, the work function of the anode 7 is aligned with the HO of the donor 11 HO1 of the active layer 5 and the work function of the cathode 3 is aligned with the LUMO of the acceptor 12 of the active layer 5.

In embodiments of the invention, a cathode 3 made of ITO has a work function (for example measured by a Kelvin probe) comprised in a range extending from 4.6 eV to 5 eV. Moreover, most donor materials 11 of the prior art have an ionization potential comprised in a range extending from 4.6 eV to 5.4 eV. One technical solution, for preventing the parasitic injection of holes from a cathode 3 made of ITO into the donor material 11 of the active layer 5, is to decrease the work function of the material making contact with the active layer 5, for example by depositing a layer between the cathode 3 and the active layer 5, corresponding to the electron-collecting layer 4.

In this embodiment of the optoelectronic device 1, the injection of parasitic holes from the cathode 3 into the active layer 5 is prevented, and therefore the dark current of the optoelectronic device 1 may be minimized or suppressed. Thus, in embodiments of the invention, the work function $\Phi_1$ of the electron-collecting layer 4 is strictly lower than the work function $\Phi_C$ of the cathode 3: the injection of parasitic holes may thus be minimized. Generally, in one embodiment of the invention, an electron-collecting layer 4 allows, in an inverted photodiode structure, one or more potential barriers to be formed that are able to block the injection of holes from said cathode 3 into said active layer 5. This potential barrier may be at the interface between the active layer 5 and the electron-collecting layer 4 and/or at the interface between the electron-collecting layer 4 and the cathode 3.

Ethoxylated polyethylenimine (PETE) may also be used to produce the electron-collecting layer 4. In embodiments of the invention, it is possible to use a layer of evaporated silver as anode 7 and a material chosen from PEDOT:PSS and metal oxides such as $NiO_xO_y$, $Cu_xO_y$, or $Mo_xO_y$, to produce the hole-collecting layer 6.

Figure 6:
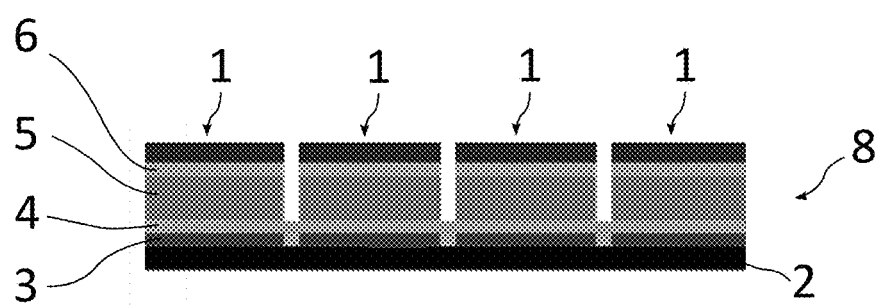
FIG. 6 schematically illustrates a matrix-array optoelectronic device according to one embodiment of the invention.

FIG. 6 schematically illustrates a matrix-array optoelectronic device 8 according to one embodiment of the invention. A matrix-array optoelectronic device 8 according to the invention includes a plurality of optoelectronic devices 1. For example, four optoelectronic devices 1 are shown in FIG. 6. A matrix-array optoelectronic device 8 includes, according to one embodiment of the invention, an electron-collecting layer 4 that is common to at least one portion of the optoelectronic devices 1 and materially continuous between each of the optoelectronic devices 1 of the portion. In embodiments of the invention, the common electron-collecting layer 4 has a sheet resistance strictly higher than $10^8 \Omega$, preferably strictly higher than $10^{10} \Omega$ and preferably strictly higher than $10^{11} \Omega$, and may be able to block currents of charge carriers between said optoelectronic devices 1 of said portion or portions, in said material of said common electron-collecting layer 4. In this way, it is possible to prevent leakage currents between various optoelectronic devices 1 of a given matrix array, while depositing the common electron-collecting layer 4 without an additional lithography step.

In preferred embodiments of the invention, the common electron-collecting layer 4 is made of ZnO. The thickness of the common electron-collecting layer 4 may be larger than 1 nm, preferably comprised between 5 and 500 nm and preferably comprised between 10 and 40 nm. The common electron-collecting layer 4 is, for example, deposited by cathode sputtering.

Figure 7:
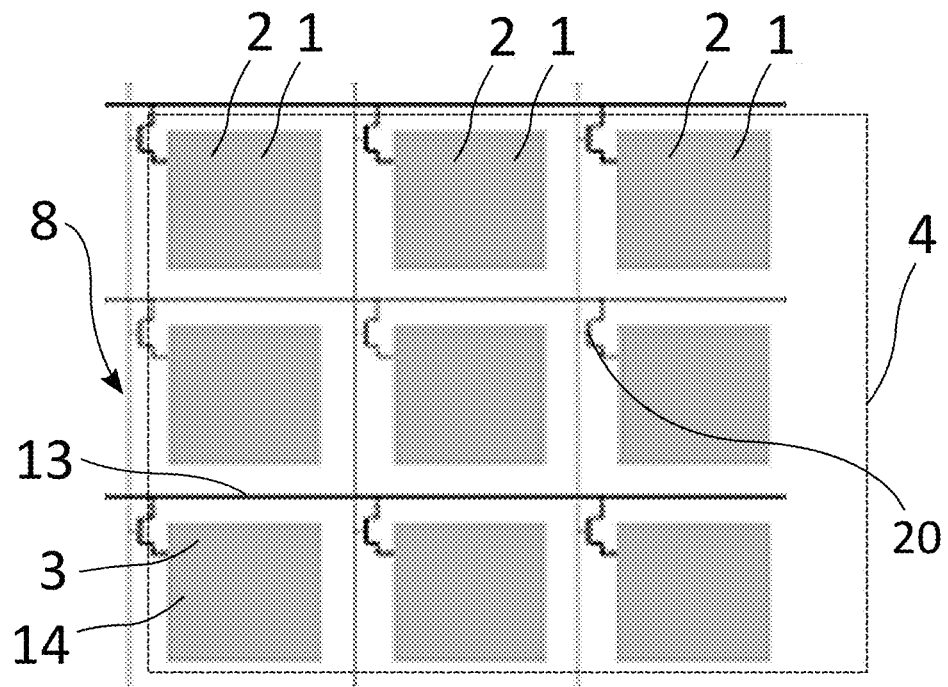
FIG. 7 schematically illustrates a matrix-array optoelectronic device, seen from above, according to one embodiment of the invention.

FIG. 7 schematically illustrates a matrix-array optoelectronic device 8, seen from above, according to one embodiment of the invention. Rows 13 and columns 14, which are made of electrically conductive material, are connected to a TFT matrix array 20, making it possible to multiplex the electrical connections between each of the optoelectronic devices 1 and the exterior of the matrix-array optoelectronic device 8, with a view to biasing and/or collecting the charge generated by illumination.

The square gray zones illustrated in FIG. 7 correspond to the limits of the optoelectronic devices 1 arranged in the gray portion. Each TFT 20 is electrically connected to a bottom electrode of the matrix-array optoelectronic device 8, for example a cathode 3 the geometry of which is also defined by a gray square. The black-dashed square corresponds to an example zone of deposition of the common electron-collecting layer 4. This illustration is schematic and intended to allow the system to be understood: a common electron-collecting layer 4 may cover several million cathodes 3.

Figure 8:
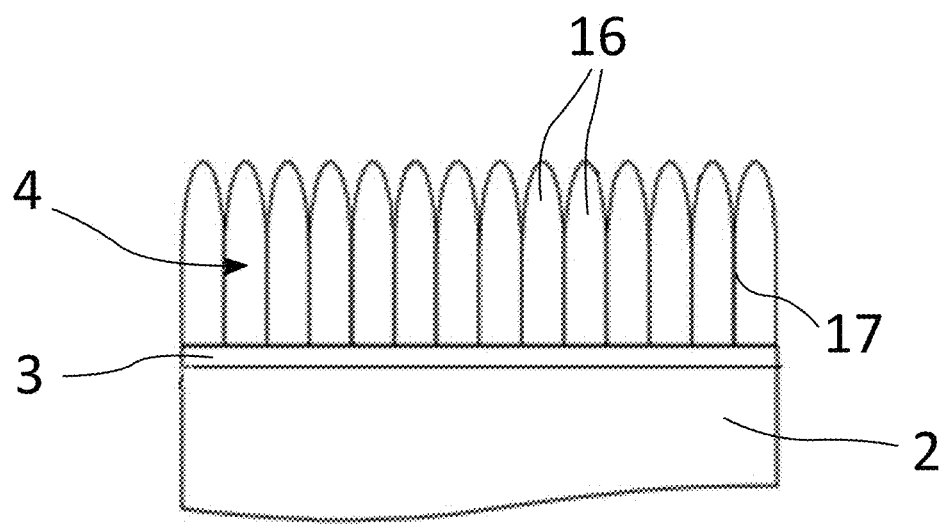
FIG. 8 schematically illustrates the cross section of one portion of an optoelectronic device, including a crystallite-containing electron-collecting layer.

FIG. 8 schematically illustrates a cross section in the thickness direction of the layers of a portion of an optoelectronic device 1 including an electron-collecting layer 4 that includes crystallites 16. The crystallites 16 are arranged in columns in the thickness direction of the electron-collecting layer 4. In one embodiment of the invention, the common electron-collecting layer 4 includes a plurality of crystallites 16. Advantageously, the material of the electron-collecting layer 4 is deposited so as to grow in columns from the cathode 3. In this way, the lateral conductivity of the electron-collecting layer 4 (i.e. in a direction of the main plane of the electron-collecting layer 4) is limited by virtue of the presence of grain boundaries 17. In the embodiment illustrated in FIG. 8, the conductivity of the electron-collecting layer 4 is substantially unchanged in the thickness direction of the layer with respect to an isotropic organization of the material of the electron-collecting layer 4. In contrast, the resistance in a direction of the main plane of the layer is dependent on the density of grain boundaries 17 and/or of crystallites 16. The deposition temperature of the material of the electron-collecting layer 4 is also a variable on which this lateral resistance depends. The deposition temperature influences the size of the crystallites of the electron-collecting layer 4. Particularly, when the size of the crystallites 16 increases (when the deposition temperature is increased for example), the density of the boundaries 17 between the crystallites 16 decreases and the lateral resistance decreases. In contrast, if the size of the crystallites 16 decreases, scattering from the boundaries 17 of the crystallites 16 becomes preponderant and the lateral resistance increases. More generally, in embodiments of the invention, the resistivity of the material of the common electron-collecting layer 4 is lower in the thickness direction of said electron-collecting layer 4 than in a direction of the main plane of said electron-collecting layer 4. Even more generally, the resistivity of the material of the electron-collecting layer 4 is anisotropic in embodiments of the invention.

In embodiments of the invention, the work function of the material of the electron-collecting layer 4, such as that of ZnO, is preferably comprised between 4 eV and 4.7 eV for $\Phi_C=4.7$ eV, $\chi_D=3.7$ eV, $EI_D=5.15$ eV. A work function of this material lower than 4.7 eV allows the operation of the optoelectronic device 1 or of the matrix-array optoelectronic device 8 to be guaranteed, and a work function higher than 4 eV allows the injection of parasitic charge carriers in the optoelectronic device or the matrix-array optoelectronic device 8 to be minimized or suppressed.

Generally, undoped zinc oxide is considered to be an n-type semiconductor. The process via which the electron-collecting layer 4 is deposited, in particular when the material is ZnO, allows its electrical conduction properties to be changed. For a room temperature deposition, and for an atmosphere containing more than 1% by mass dioxygen, and preferably more than 2% by mass dioxygen, the resistance of an electron-collecting layer 4 made of ZnO is comprised between $10^9$ and $10^{12}\Omega/\square$. For a deposition temperature comprised between 100° C. and 400° C., and in the presence of dioxygen, the sheet resistance is substantially constant and equal to 1 $\Omega/\square$.

More generally, one embodiment of the invention is a process for manufacturing an optoelectronic device 1 and/or a matrix-array optoelectronic device 8 including at least one step of depositing the material of an electron-collecting layer 4 using a physical thin-film deposition method, for example cathode sputtering, at a temperature comprised between 0° C. and 100° C. inclusive, in an atmosphere containing at least 1% by mass dioxygen, and preferably 2% by mass dioxygen.

The resistance of the deposited layer is decreased via an anneal (heat treatment) after a deposition carried out at a temperature comprised between 0° C. and 100° C. For example, for an electron-collecting layer 4 made of ZnO, a heat treatment at a temperature above 200° C. leads to a sheet resistance comprised between $10\Omega/\square$ and $10^9\Omega/\square$. This decrease in resistance achieved by carrying out a heat treatment may be attributed to the oxidation of the ZnO in the presence of air. The resistance of an electron-collecting layer 4 may be adjusted via the process of depositing and annealing said layer.

Figure 9:
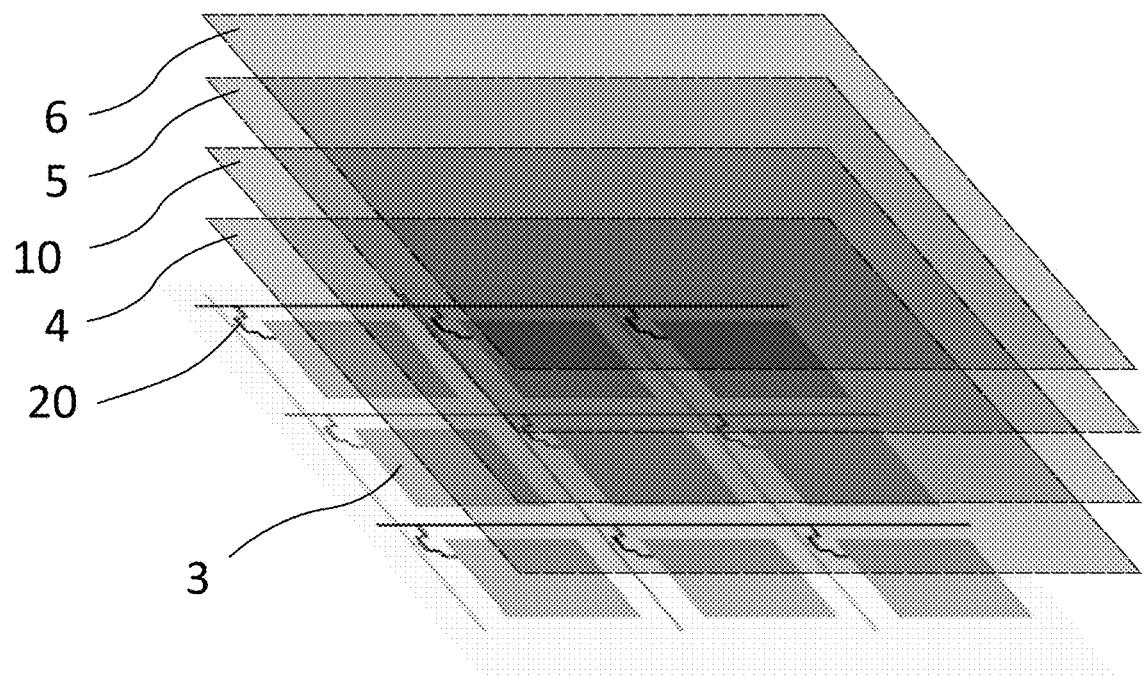
FIG. 9 schematically illustrates thin layers arranged on the substrate of a matrix-array optoelectronic device according to one embodiment of the invention.

FIG. 9 schematically illustrates the thin layers arranged on a substrate of a matrix-array optoelectronic device 8 according to one embodiment of the invention. The various layers have been spaced apart in order to allow the schematic to be understood, although they make direct contact in one embodiment of the invention. Depending on the technological parameters used in the production of a matrix-array optoelectronic device 8, the resistivity of the ZnO of an electron-collecting layer 4 may not have a straightforward dependency on deposition temperature or the temperature of the post-deposition anneal. The resistivity of the material of the electron-collecting layer 4 may also depend on its environment. For example, in the presence of oxygen, an adsorption and desorption process occurs at the surface of the electron-collecting layer 4. Oxidizing molecules in the gaseous state, such as dioxygen, may be adsorbed at the surface of the ZnO and be converted into negative ions $O_2^-$. This process creates a zone that is depleted of free charge carriers and decreases the conductivity of the surface of the electron-collecting layer 4 according to equation 1:

$$O_2^{(gas)} + e^- \rightarrow O_2^{-(adsorbed)} \quad (1)$$

In the presence of an illumination, photo-generated holes may move toward the surface of the electron-collecting layer 4 and neutralize the negative oxygen ions. This leads to an increase in the conductivity at the surface of the electron-collecting layer 4 according to equation 2:

$$O_2^- + h^+ \rightarrow O_2^{(gas)} \quad (2)$$

The resistivity and work function of the material of the electron-collecting layer 4 are sensitive to light, as explained above. In order to stabilize the electron-collecting layer 4, a stabilizing layer 10, which has a higher stability to light, may be deposited above the electron-collecting layer 4. This stabilizing layer 10 may for example be made of tin oxide ($SnO_x$) or of palladium oxide ($PdO_x$) the resistances of which are high, for example strictly higher than $10^8\Omega/\square$ and preferably strictly higher than $10^{10}\Omega/\square$. A stabilizing layer 10 may more generally be made of a material of opaque oxide type. The thickness of a stabilizing layer 10 is for example comprised between 1 and 500 nm and preferably comprised between 10 and 50 nm. Generally, in one embodiment of the invention, a matrix-array optoelectronic device 8 includes a stabilizing layer 10 that is arranged between a common electron-collecting layer 4 and at least one active layer 5, the stabilizing layer 10 being able to decrease the dependency of the resistivity of the material of the common electron-collecting layer 4 on luminosity. In FIG. 9, each gray square corresponds to a layer deposited to produce a matrix-array optoelectronic device 8: a stabilizing layer 10 is deposited between the common electron-collecting layer 4 and one or more active layers 5. In embodiments of the invention, the electron-collecting layer 4, the stabilizing layer 10, the active layer 5, and/or the hole-collecting layer 6 may be common to one portion or to all of the optoelectronic devices 1 of the matrix-array optoelectronic device 8.

An electron-collecting layer 4 may be doped with p-type impurities or elements. These elements are for example copper, nickel, cobalt, palladium, molybdenum, manganese and/or iron. A p-type impurity present in an electron-collecting layer 4, for example made of ZnO, allows the electrical conductivity associated with positive charge carriers (holes) that block the electrical current and increase the resistance of the material of the electron-collecting layer 4 to be limited. Generally, a common electron-collecting layer 4 may include p-type elements, and advantageously palladium, cobalt and/or copper in order to form p-type semiconductor or insulating oxides such as PdO, CoO or CuO for example.

In embodiments of the invention, a sol-gel method is used to produce an electron-collecting layer 4. The sol-gel deposition method has the advantage of being simple to implement and inexpensive. Implementation of a sol-gel process is described below. In one embodiment of the invention, a process for manufacturing an optoelectronic device 1 and/or a matrix-array optoelectronic device 8 includes at least one step of forming a said electron-collecting layer 4 using a sol-gel process, the sol-gel process including a step of depositing a solution containing precursor polymers 15. Said precursor polymers 15 may be obtained from metal acetates, metal nitrates and/or metal chlorides.

A sol-gel process does not require a specific piece of complex equipment, in contrast to a sputtering method carried out in a partial vacuum. This process consists in spreading with a spin coater or with printing equipment (inkjet printing, screen printing) on a substrate a solution containing a solvent and polymers 15 that are precursors of the material of the electron-collecting layer 4, for example ZnO. The solvent is then evaporated and a heat treatment may subsequently allow the layer formed to be crystallized. Generally, a deposited layer is not very dense but very resistive if the temperature of the post-deposition heat treatment is below 400° C. In the case of formation of ZnO, the electron-collecting layer 4 contains ZnO and organic residues left over from the synthesis (for example precursor polymers 15, additives and/or solvent). These synthesis residues influence the electrical conductivity of an electron-collecting layer 4.

Figure 10:
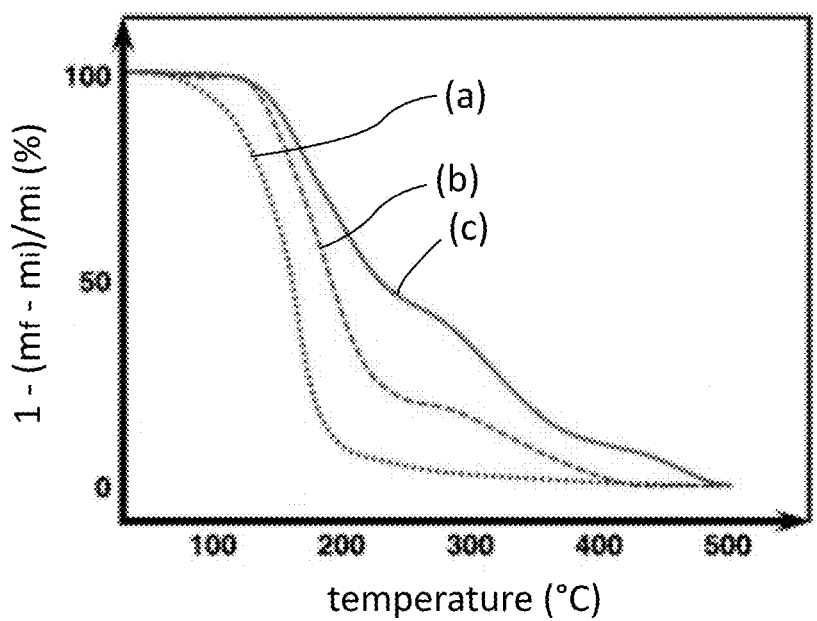
FIG. 10 illustrates a graph of the variation of the concentration of precursors of a normalized sol-gel reaction.

FIG. 10 illustrates in a graph the variation in the normalized concentration of precursor polymers 15 of a sol-gel reaction, obtained by gravimetric analysis, after a heat treatment subsequent to the deposition. More precisely, the illustrated ratio corresponds to $1-(m_f-m_i)/m_i$, $m_f$ being the final mass in the precursor polymers 15 for a given species and $m_i$ the initial mass in precursor polymers 15 for a given species.

Curve (a), the dotted line, illustrates this ratio as a function of the temperature of the heat treatment for the use of precursor polymers 15 of nitrate type. Curve (b), the dashed line, illustrates this ratio as a function of the temperature of the heat treatment for the use of precursor polymers 15 of acetate type. Curve (c), the solid line, illustrates this ratio as a function of the temperature of the heat treatment for the use of precursor polymers 15 of chloride type.

Figure 11:
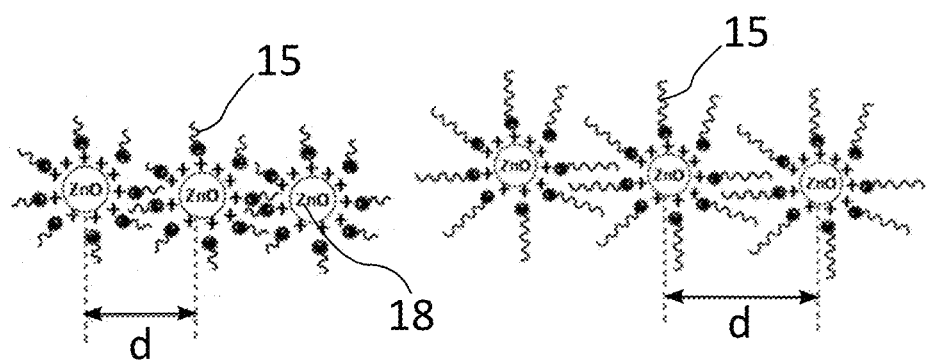
FIG. 11 schematically illustrates the influence of the size of the precursor polymers on the distance between particles of ZnO.

FIG. 11 schematically illustrates the influence of the size of the precursor polymers 15 on the distance between the particles of ZnO. The chemical nature of the precursor polymers 15 used is a variable on which the distance between the various particles, or aggregates 18 of ZnO formed during the sol-gel process depends. Generally, the electrical resistance of an electron-collecting layer 4 varies proportionally with the distance d between the nearest-neighbor aggregates 18 of ZnO. In embodiments of the invention, the temperature of the heat treatment subsequent to the deposition and the distance d may be adjusted so that the minimum sheet resistance of the material of an electron-collecting layer 4 is higher than $10^8 \Omega/\square$.

Figure 12:
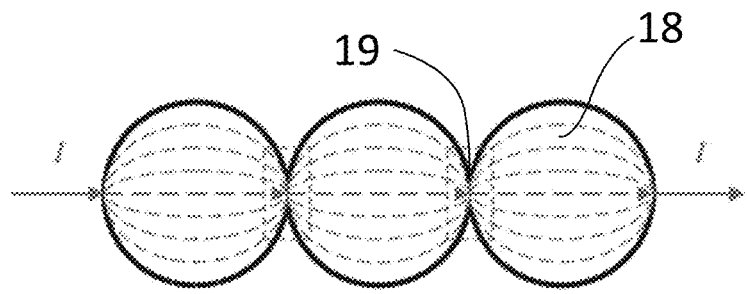
FIG. 12 schematically illustrates the decrease in electrical conductivity when organic residues are present in an electron-collecting layer.

FIG. 12 schematically illustrates the decrease in electrical conductivity when organic residues 19 are present in an electron-collecting layer 4. The dashed lines illustrate lines of currents in the aggregates 18 of ZnO: the residues 19 are concentrated in the boundaries between the aggregates 18. The constrictions formed between the aggregates 18 and the presence of residues 19 in these constrictions are liable to make the material more electrically resistive.

In one embodiment of the invention, it is possible to use a sol-gel deposition process that may be qualified a process by "complex polymerization route". This process comprises the steps of:

adding metal acetates and/or metal nitrates and/or metal chlorides to a solvent of 2-methoxyethanol and stirring, at 50° C., until dissolved in the solvent;

forming a metal complex by adding ethanolamine acetic acid to the solvent, at 70° C. The ions formed are metal and acetate ions;

waiting, during a polymerization reaction, until precursor polymers 15 are obtained while stirring the solvent, at 70° C.; and depositing the solution of precursor polymers 15 on a cathode 3.

This process has the advantage of being suitable for the synthesis of complex or mixed oxides from common metal salts such as chlorides, acetates and/or nitrates. Advantageously, it is chosen to use acetates in the implementation of the process described in the preceding paragraph: they are insensitive to the presence of water in the solution and therefore more stable. There is thus no need to implement the process in an inert atmosphere if acetates are used. Advantageously, the acetates form after partial decomposition of electrically stable oxides. Their use allows electron-collecting layers 4 to be reproducibly produced. The use of acetic acid allows the precipitation of metal ions in the second step of the sol-gel process described above to be avoided, and the lifetime of the solution prepared for the implementation of the sol-gel process to be increased. Ethanolamine is a complexing agent and allows the polymerizing step of the process to be stabilized and promoted.

In one embodiment, p-type dopants (Pd, Cu, Ni, Co) may be added during the sol-gel process so as to decrease the conductivity of the electron-collecting layer 4 after heat treatment.

In one embodiment of the invention, an electron-collecting layer 4 is formed by depositing ZnO nanoparticles, grafted with ethoxylated polyethylenimine (PEIE). By nanoparticle, what is meant is a particle the characteristic size of which, such as the diameter for a sphere, is comprised between 0.1 nm and 100 nm. Since PEIE is an insulating polymer, electron-collecting layers 4 produced with ZnO nanoparticles grafted with PEIE have a very high sheet resistance, for example higher than $10^{10} \Omega/\square$. The PEIE may be grafted to the ZnO particles via hydroxyl or amine groups. More generally, an optoelectronic device 1 and/or a matrix-array optoelectronic device 8 may include metal-oxide nanoparticles and polar polymers grafted onto the metal-oxide nanoparticles.

Figure 13:
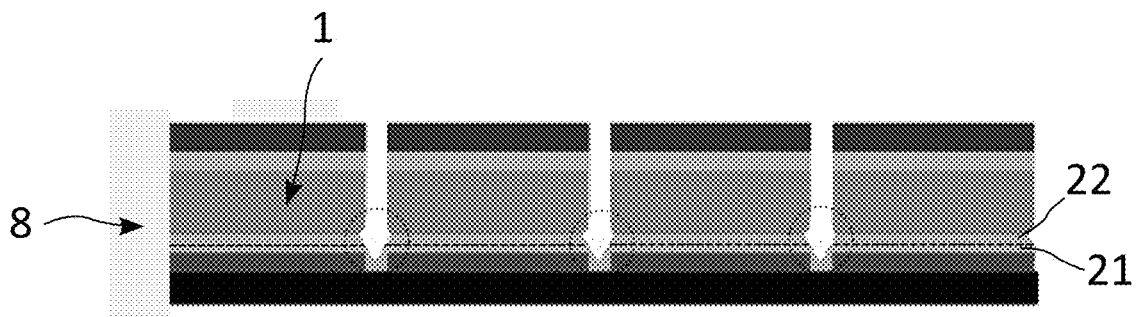
FIG. 13 schematically illustrates a matrix-array optoelectronic device in which the resistance of an electron-collecting layer is increased via a step of etching said layer.

FIG. 13 schematically illustrates a matrix-array optoelectronic device 8 in which the resistance of an electron-collecting layer 4 is increased by producing said layer in two depositing steps, forming two types of sublayers. The two sublayers are separated by a dashed line in FIG. 13. A first deposition may be carried out, forming a first sublayer 21 with a thickness for example comprised between 10 nm and 15 nm. This first sublayer 21 is common, and deposited between the optoelectronic devices 1 (i.e. between the various pixels). A second deposition may be carried out forming a plurality of thicker second sublayers 22. The deposition of the sublayers 22 is carried out in a pattern corresponding to the pattern of the arrangement of the optoelectronic devices 1. The deposition of the second sublayers 22 may be carried out through a metal mask that is etched in locations corresponding to the optoelectronic devices 1.

In one process for manufacturing a matrix-array optoelectronic device 8, it is possible to decrease the thickness of an electron-collecting layer 4 between optoelectronic devices 1 so as to locally increase the sheet resistance of the electron-collecting layer 4.

In one embodiment of the invention, at least one element chosen from a substrate 2, a cathode 3, an electron-collecting layer 4, an active layer 5, a hole-collecting layer 6 and an anode 7 is transparent.

Figure 14:
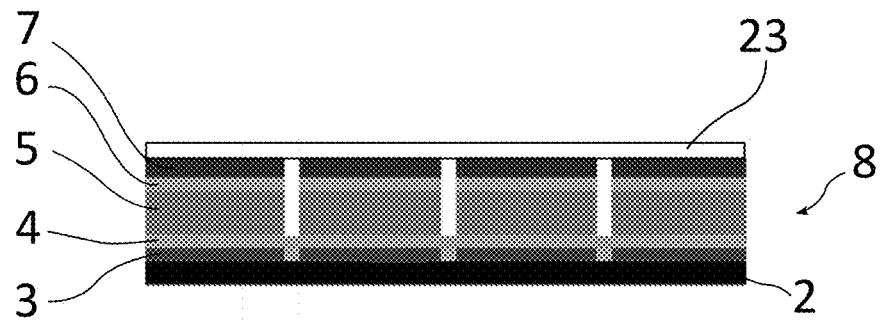
FIG. 14 illustrates one embodiment of the invention, in which embodiment a matrix-array optoelectronic device includes a layer of scintillator material.

FIG. 14 illustrates an embodiment of the invention in which a matrix-array optoelectronic device 8 includes a layer of scintillator material 23. In embodiments of the invention, a layer of scintillator material 23 may be arranged on each of the anodes 7 of the matrix-array optoelectronic device 8. By scintillator material, what is meant is a material that is able to emit light, for example in the visible spectrum, following absorption of ionizing radiation, for example following the absorption of x-rays. Advantageously, a hole-collecting layer 6 and an anode 7 are transparent in this embodiment. Thus, the device 8 may be able to image x-rays.

In embodiments of the invention, the detection of x-rays may be carried out directly in the active layer. In this case, it is not necessary for the substrate 2, the cathode 3, the electron-collecting layer 4, the hole-collecting layer 6 and/or the anode 7 to be transparent.

The invention claimed is:

1. A matrix-array optoelectronic device including a plurality of optoelectronic devices each comprising a stack of planar thin layers that are arranged on an electrically insulating substrate, including at least:
   one cathode made of a material of work function $\Phi_c$;
   one electron-collecting layer that is arranged above said cathode and that is made of a material of work function $\Phi_1$ and of sheet resistance R;
   one active layer comprising at least one p-type organic semiconductor, the energy level of the highest occupied molecular orbital of which is HO1, and an n-type semiconductor, said layer being suitable for emitting or detecting light and being arranged above said electron-collecting layer;
   one hole-collecting layer that is arranged above said active layer; and
   one anode that is arranged above said hole-collecting layer; wherein:
   said work function $\Phi_1$ of said electron-collecting layer and said energy level HO1 of said active layer form a potential barrier able to block the injection of holes from said cathode into said active layer; and
   said sheet resistance R of said electron-collecting layer is higher than or equal to $10^8 \Omega$,
   wherein the matrix-array optoelectronic device further includes said electron-collecting layer that is common to at least one portion of said optoelectronic devices and materially continuous between each of said optoelectronic devices.

2. The matrix-array optoelectronic device as claimed in claim 1, wherein said work function $\Phi_1$ of said electron-collecting layer is strictly lower than said work function $\Phi_c$ of said cathode.

3. The matrix-array optoelectronic device as claimed in claim 1, wherein said material of said electron-collecting layer is chosen from zinc oxide and titanium oxide.

4. The matrix-array optoelectronic device as claimed in claim 1, wherein said sheet resistance R of said common collecting layer is able to block currents of charge carriers between said optoelectronic devices of said portion or portions, in said material of said common collecting layer.

5. The matrix-array optoelectronic device as claimed in claim 1, wherein the resistivity of said material of said common electron-collecting layer is lower in the thickness direction of said electron-collecting layer than in a direction of the main plane of said electron-collecting layer.

6. The matrix-array optoelectronic device as claimed in claim 1, wherein said common electron-collecting layer includes crystallites that are arranged in columns in the thickness direction of said electron-collecting layer.

7. The matrix-array optoelectronic device as claimed in claim 1, including at least one stabilizing layer arranged between said common electron-collecting layer and at least one active layer, wherein said stabilizing layer is able to decrease the dependency of the resistivity of the material of a said common electron-collecting layer on luminosity.

8. The matrix-array optoelectronic device as claimed in claim 7, wherein the material of said stabilizing layer is an opaque oxide that is preferably chosen from tin oxide and palladium oxide.

9. The matrix-array optoelectronic device as claimed in claim 1, wherein the material of said common electron-collecting layer includes p-type dopants.

10. The matrix-array optoelectronic device as claimed in claim 1, wherein said p-type dopants are chosen from palladium, cobalt, copper and molybdenum.

11. The matrix-array optoelectronic device as claimed in claim 1, wherein at least one said electron-collecting layer includes metal-oxide nanoparticles and polar polymers, said polar polymers being grafted onto said metal-oxide nanoparticles.

12. The matrix-array optoelectronic device as claimed in claim 1, wherein at least one element chosen from a substrate, a cathode, an electron-collecting layer, an active layer, a hole-collecting layer and an anode is transparent.

13. The matrix-array optoelectronic device as claimed in claim 1, including a layer of scintillator material, said layer being arranged above each said anode.

\* \* \* \* \*